United States Patent
Wang

(10) Patent No.: US 9,891,255 B2
(45) Date of Patent: Feb. 13, 2018

(54) FINGERPRINT IDENTIFICATION DEVICE, ELECTRONIC DEVICE AND FINGERPRINT IDENTIFICATION METHOD

(71) Applicant: MiiCs & Partners (Shenzhen) Co., Ltd., Shenzhen (CN)

(72) Inventor: Juan Wang, Shenzhen (CN)

(73) Assignee: MiiCs & Partners (Shenzhen) Co., Ltd., Shenzhen (CN)

( * ) Notice: Subject to any disclaimer, the term of this patent is extended or adjusted under 35 U.S.C. 154(b) by 55 days.

(21) Appl. No.: 15/088,759

(22) Filed: Apr. 1, 2016

(65) Prior Publication Data

US 2017/0177919 A1 Jun. 22, 2017

(30) Foreign Application Priority Data

Dec. 18, 2015 (CN) .......................... 2015 1 0948942

(51) Int. Cl.
*G06K 9/00* (2006.01)
*G01R 27/26* (2006.01)
*G06F 3/044* (2006.01)

(52) U.S. Cl.
CPC ......... *G01R 27/2605* (2013.01); *G06F 3/044* (2013.01); *G06K 9/00013* (2013.01); *H04M 2250/22* (2013.01)

(58) Field of Classification Search
CPC .. G06K 9/0002; G06F 3/044; G01R 27/2605; H04M 2250/22

USPC .......................................................... 382/124
See application file for complete search history.

(56) References Cited

U.S. PATENT DOCUMENTS

| | | | | |
|---|---|---|---|---|
| 6,459,804 | B2* | 10/2002 | Mainguet | G06K 9/00026 382/124 |
| 8,564,314 | B2* | 10/2013 | Shaikh | G06K 9/0002 324/658 |
| 8,888,004 | B2* | 11/2014 | Setlak | G06K 9/0002 235/439 |
| 9,471,826 | B2* | 10/2016 | Ramrattan | G06K 9/00033 |
| 9,600,705 | B2* | 3/2017 | Riedijk | G06K 9/0002 |
| 2013/0287274 | A1* | 10/2013 | Shi | G06F 3/044 382/124 |

* cited by examiner

*Primary Examiner* — Kanjibhai Patel
(74) *Attorney, Agent, or Firm* — ScienBiziP, P.C.

(57) ABSTRACT

A fingerprint identification device includes a fingerprint identification element configured to identify fingerprint and a capacitive touch sensor configured to continuously detect whether an object is touching the fingerprint identification element. A controller is electrically connected to the fingerprint identification element and the capacitive touch sensor. The controller is configured to control the capacitive touch sensor to stop detecting and the fingerprint identification element to start working when the capacitive touch sensor detects that an object is touching the fingerprint identification element.

16 Claims, 11 Drawing Sheets

FINGERPRINT IDENTIFICATION DEVICE, ELECTRONIC DEVICE AND FINGERPRINT IDENTIFICATION METHOD

FIELD

The subject matter herein generally relates to a fingerprint identification device, an electronic device using the fingerprint identification device, and a fingerprint identification method.

BACKGROUND

To perform certain functions an electronic device may require authentication or a password. One may provide authentication by using fingerprint identification devices. Many electronic devices include fingerprint identification devices.

BRIEF DESCRIPTION OF THE DRAWINGS

Implementations of the present technology will now be described, by way of example only, with reference to the attached figures.

DETAILED DESCRIPTION

Figure 1:
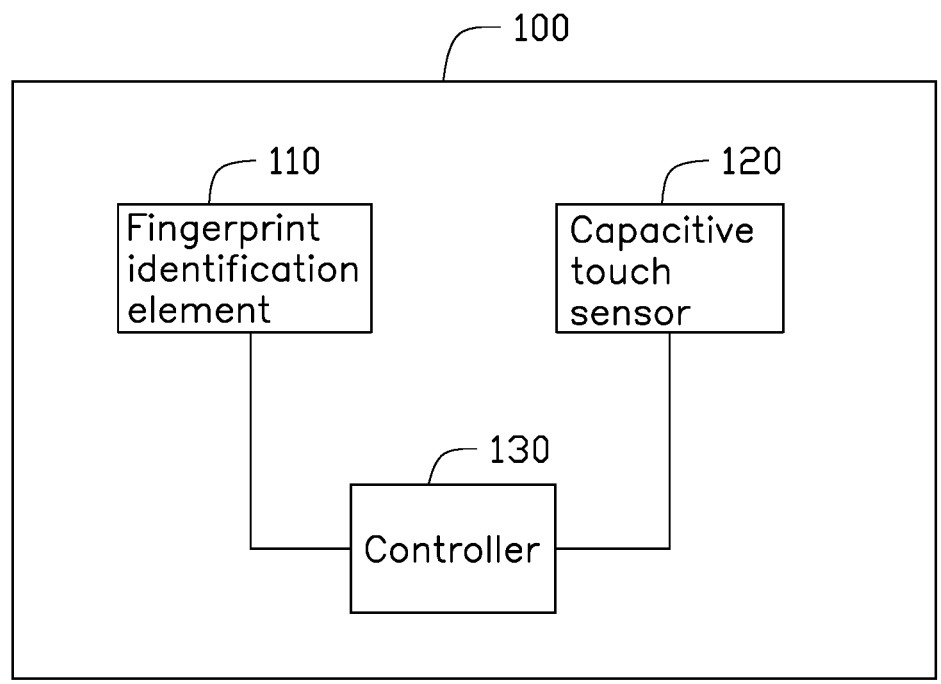
FIG. 1 is a block diagram of an exemplary embodiment of a fingerprint identification device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

Figure 2:
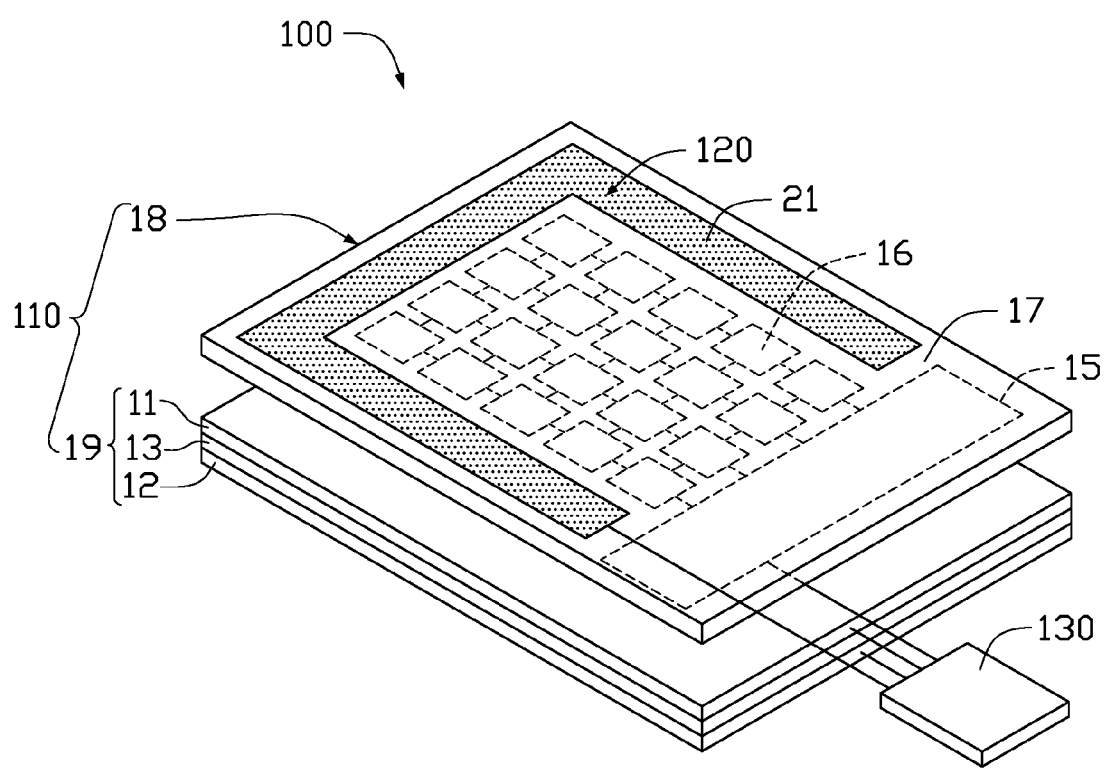
FIG. 2 is an isometric view of a first embodiment of a fingerprint identification device.
Figure 8:
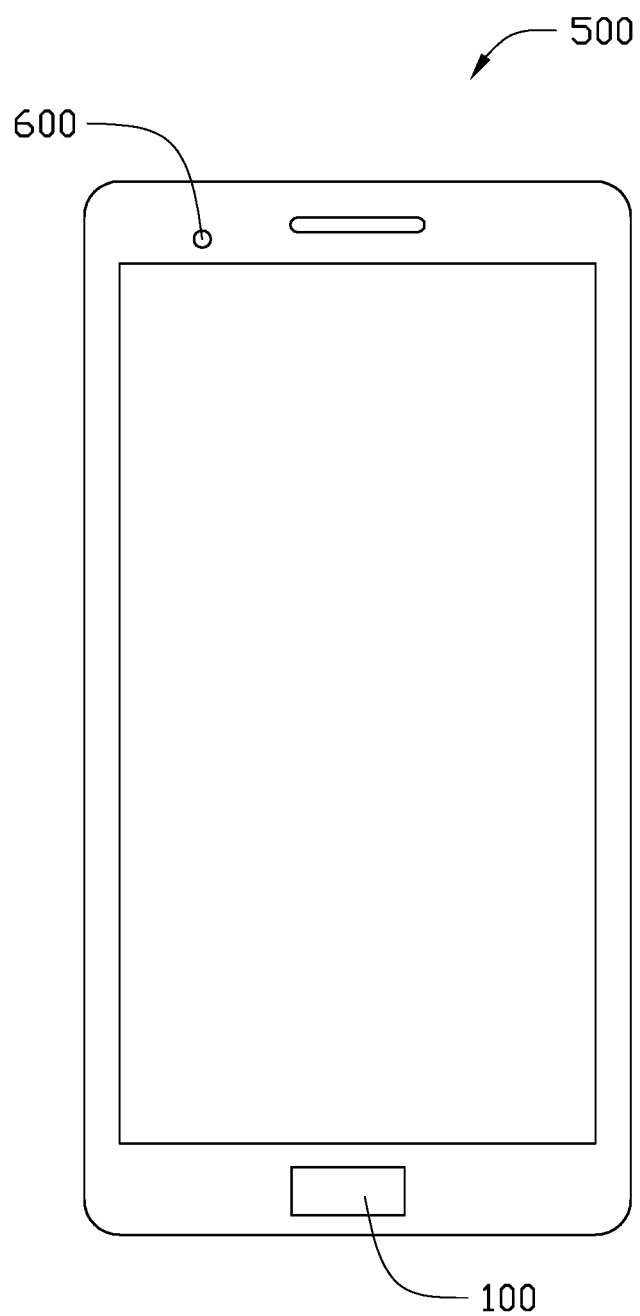
FIG. 8 is an isometric view of an exemplary embodiment of an electronic device using a fingerprint identification device.

FIG. 1 and FIG. 2 illustrate a fingerprint identification device 100 according to a first exemplary embodiment. The fingerprint identification device 100 may be applied in an electronic device 500 such as a mobile phone as shown in FIG. 8. The fingerprint identification device 100 comprises a fingerprint identification element 110, a capacitive touch sensor 120, and a controller 130. The capacitive touch sensor 120 is configured to continuously detect whether an object (such as a finger) is touching the fingerprint identification element 110. The fingerprint identification element 110 is configured for identifying fingerprint. The controller 130 is electrically connected to the fingerprint identification element 110 and the capacitive touch sensor 120. When the capacitive touch sensor 120 detects that an object (such as a finger, not shown) is touching the fingerprint identification element 110, the controller 130 controls the capacitive touch sensor 120 to stop detecting, and controls the fingerprint identification element 110 to start working.

The fingerprint identification element 110 may be an area-array sensor defining a fingerprint identification area (not shown). The capacitive touch sensor 120 is positioned on the fingerprint identification element 110 and located around the fingerprint identification area. When an object (such as a finger) is touching the fingerprint identification device 100, the object (not shown) can cover the whole of the fingerprint identification area and at least a portion of the capacitive touch sensor 120. For example, when the fingerprint identification device 100 is used in a mobile phone in the form of a button (such as the Home button) of the mobile phone, the total size of the fingerprint identification area and a surface area occupied by capacitive touch sensor 120 is not bigger in surface area than a size of a regular button, ensuring that the object can cover the whole of the fingerprint identification area and at least a portion of the capacitive touch sensor 120.

In at least one embodiment, the fingerprint identification element 110 is an ultrasonic area-array sensor for fingerprint identification. The fingerprint identification element 110 comprises a signal sending layer 19 and a signal receiving layer 18 stacked over the signal sending layer 19. The signal sending layer 19 comprises a first electrode layer 11, a second electrode layer 12, and a piezoelectric layer 13 sandwiched between the first electrode layer 11 and the second electrode layer 12. In at least one embodiment, the piezoelectric layer 13 is made of polyvinylidene fluoride. The first electrode layer 11 and the second electrode layer 12 are configured to apply a voltage to the piezoelectric layer 13. The piezoelectric layer 13 is able to vibrate and emit ultrasonic signals when a voltage is applied to the piezoelectric layer 13.

The signal receiving layer 18 comprises a glass substrate 17, a receiving array 16, and a readout circuit 15. Both the receiving array 16 and the readout circuit 15 are formed on a surface of the glass substrate 17 adjacent to the signal sending layer 19. In other words, both the receiving array 16 and the readout circuit 15 are formed between the signal sending layer 19 and the glass substrate 17. The receiving array 16 is configured to receive ultrasonic signals reflected by the object when the object is touching the fingerprint identification device 100. The readout circuit 15 is configured for converting the reflected ultrasonic signals to electrical signals.

The capacitive touch sensor 120 comprises a sensing electrode layer 21. In the illustrated embodiment, the sensing electrode layer 21 is formed on a surface of the glass substrate 17 far away from the signal sending layer 19. The sensing electrode layer 21 is located around the receiving array 16. The sensing electrode layer 21 is made of an electrically conductive material, such as indium tin oxide. The sensing electrode layer 21 is electrically connected to the controller 130. The sensing electrode layer 21 and ground form a capacitor. When an object touches the glass substrate 17 and the sensing electrode layer 21, capacitance between the sensing electrode layer 21 and the ground is changed, thus the object can be detected.

The controller 130 can be a central processing unit (CPU), a microprocessor, or other data processor chip that performs functions of the fingerprint identification device 100. The controller 130 is electrically connected to the first electrode layer 11, the second electrode layer 12, the readout circuit 15, and the sensing electrode layer 21, respectively. When the capacitance between the sensing electrode layer 21 and ground changes, the controller 130 controls the sensing electrode layer 21 to allow the capacitive touch sensor 120 to stop working, the controller 130 also controls the first electrode layer 11 and the second electrode layer 12 to apply a voltage to the piezoelectric layer 13, and allow the fingerprint identification element 110 to start working. The fingerprint identification element 110 continuously scans the finger until output a readout signal to the controller 130. The controller 130 analyzes the readout signal to acquire a grayscale fingerprint image, and can control the first electrode layer 11 and the second electrode layer 12 to stop applying a voltage to the piezoelectric layer 13. Meanwhile, the controller 130 controls the sensing electrode layer 21 to allow the capacitive touch sensor 120 to start working.

If the fingerprint identification element 110 detects that the object is not a finger, the fingerprint identification element 110 outputs a sensing signal to the controller 130 via the readout circuit 15, and the controller 130 controls the fingerprint identification element 110 to stop working and the capacitive touch sensor 120 to start working. When the fingerprint identification element 110 detects that the object is a finger, the fingerprint identification element 110 continuously scans the finger and outputs the readout signal to the controller 130.

Figure 3A:
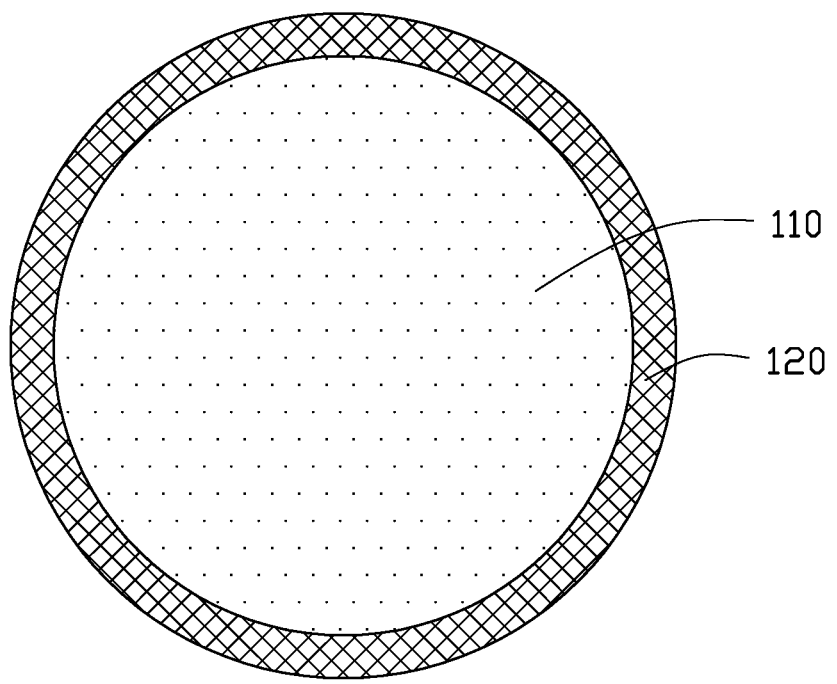
FIG. 3A through FIG. 3C are plan views of a capacitive touch sensor and a fingerprint identification element in a fingerprint identification device.
Figure 3B:
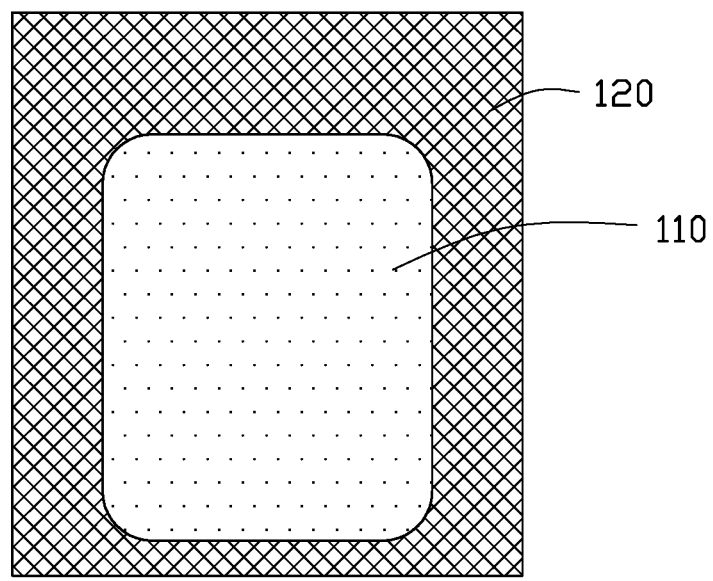
Figure 3C:
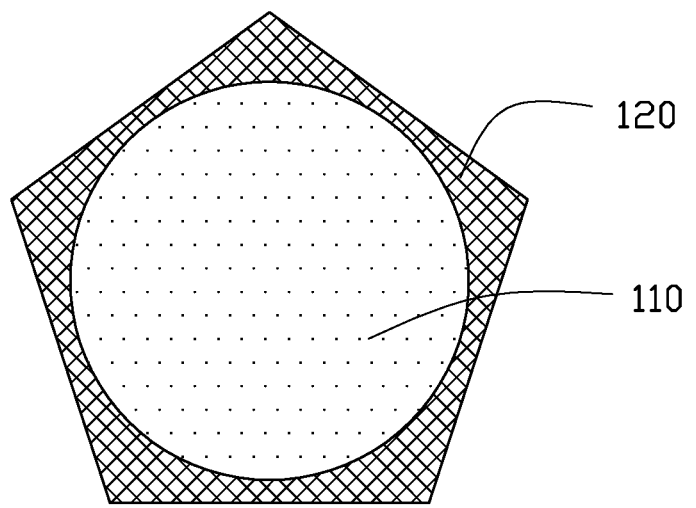

As shown in FIG. 2, the capacitive touch sensor 120 is located around the fingerprint identification element 110 and substantially has a "U" shape. In other embodiments, the capacitive touch sensor 120 shown in FIG. 3A is in the shape of a circular ring which is located around the fingerprint identification element 110. The capacitive touch sensor 120 shown in FIG. 3B is in the shape of a rectangular frame which is located around the fingerprint identification element 110. The capacitive touch sensor 120 shown in FIG. 3C is in the shape of a pentagonal frame which is located around the fingerprint identification element 110. The capacitive touch sensor 120 can be other shapes. In other embodiments, the fingerprint identification device 100 comprises more than one capacitive touch sensor 120, and the plurality of capacitive touch sensors 120 is also located around the fingerprint identification element 110.

The capacitive touch sensor 120 shown in FIG. 2 is attached to the glass substrate 17. In other embodiments, the capacitive touch sensor 120 may formed on other portions of the fingerprint identification element 110. The capacitive touch sensor 120 may also be separate from the fingerprint identification element 110. It is understood that the fingerprint identification element 110 is not limited to the above-described structure, but can have other structures. For example, the signal sending layer 19 and the signal receiving layer 18 may be located in a same layer instead of being two stacked layers.

The capacitive touch sensor 120 continuously detects whether an object is touching the fingerprint identification element 110. When the capacitive touch sensor 120 detects that an object (such as a finger) is touching the fingerprint identification element 110, the capacitive touch sensor 120 stops detecting and the fingerprint identification element 110 starts working. Power consumption of the capacitive touch sensor 120 is much lower than power consumption of the fingerprint identification element 110, thus usage of electrical power can be saved.

Figure 4:
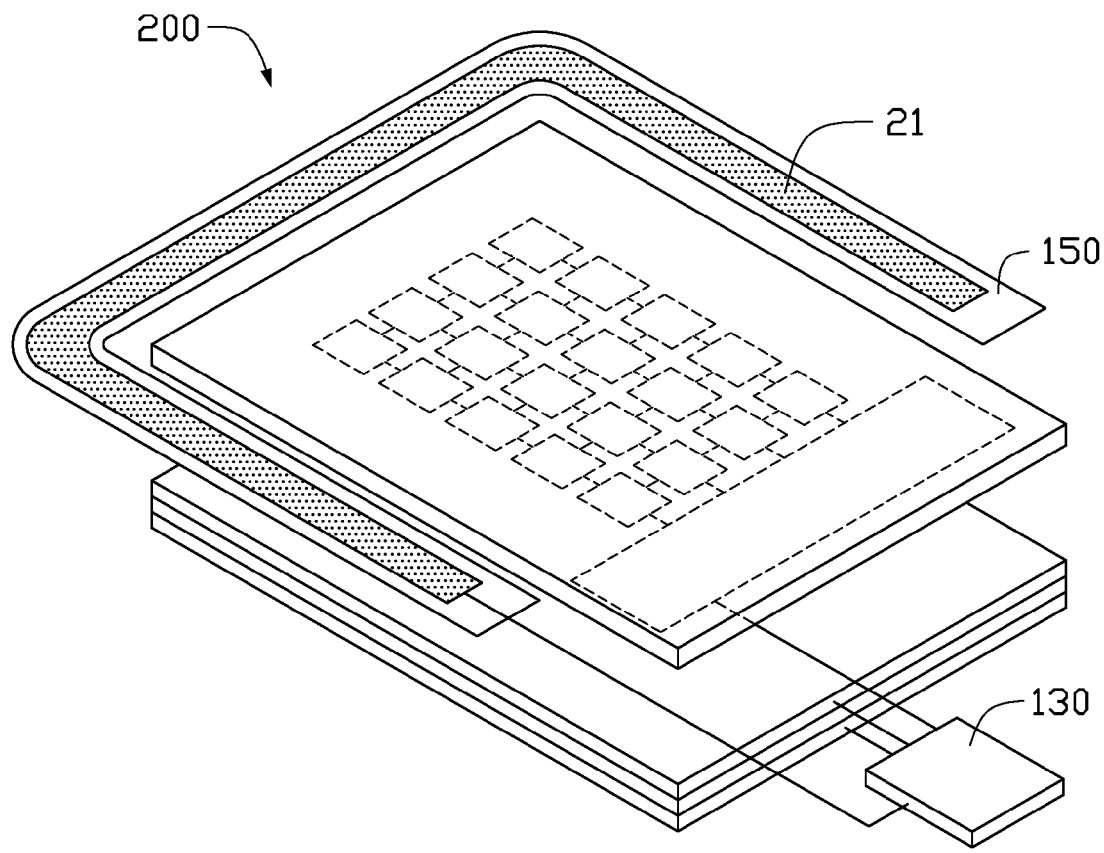
FIG. 4 is an isometric view of a second embodiment of a fingerprint identification device.

FIG. 4 illustrates a fingerprint identification device 200 according to a second exemplary embodiment. The fingerprint identification device 200 is similar to the fingerprint identification device 100 except that sensing electrode layer 21 of the fingerprint identification device 200 is formed on a flexible printed circuit board 150. The capacitive touch sensor 120 of the fingerprint identification device 200 comprises a sensing electrode layer 21 which is made of an electrically conductive material (such as indium tin oxide) and is formed on the flexible printed circuit board 150. The flexible printed circuit board 150 is configured to transmit sensing signals from the sensing electrode layer 21 to the controller 130.

Figure 5:
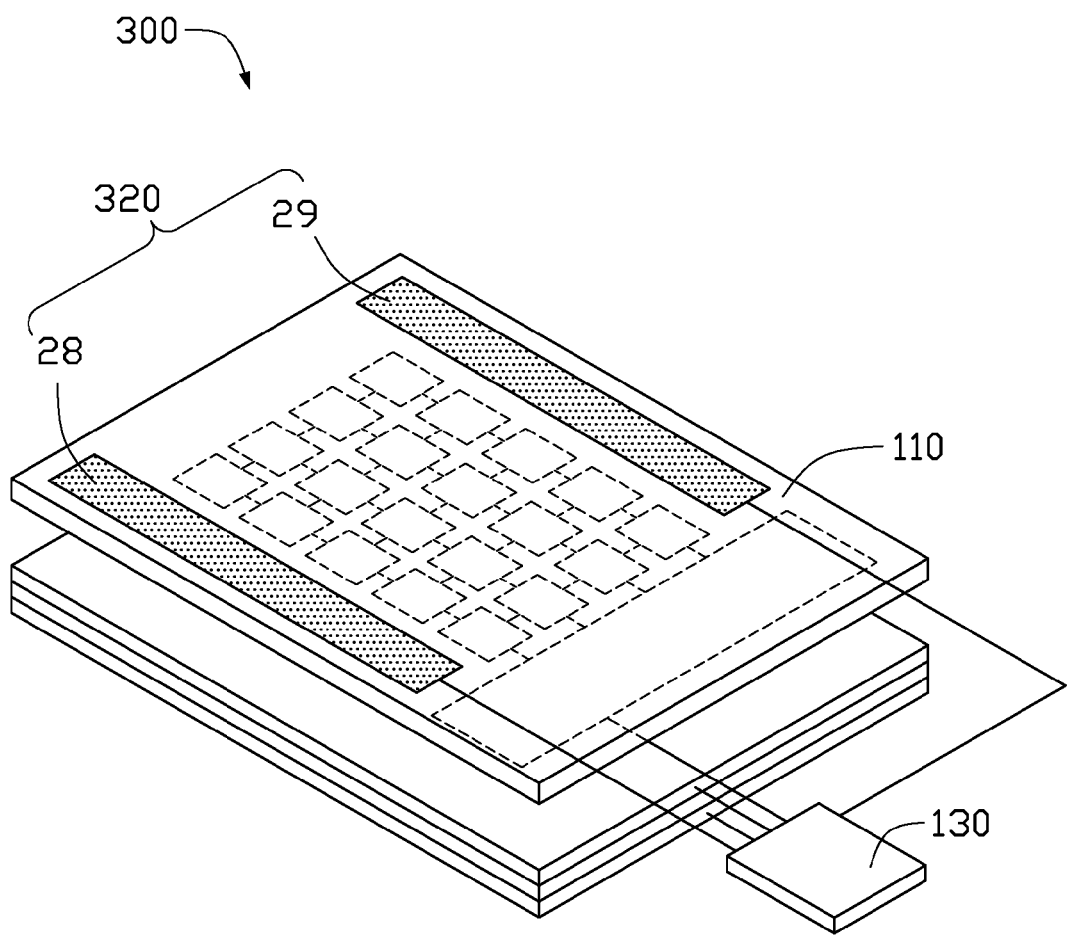
FIG. 5 is an isometric view of a third embodiment of a fingerprint identification device.

FIG. 5 illustrates a fingerprint identification device 300 according to a third exemplary embodiment. The fingerprint identification device 300 is similar to the fingerprint identification device 100 except that a capacitive touch sensor 320 of the fingerprint identification device 300 comprises a sending sensing electrode layer 28 and a receiving sensing electrode layer 29 formed on the fingerprint identification element 110. Both the sending sensing electrode layer 28 and the receiving sensing electrode layer 29 are made of an electrically conductive material (indium tin oxide for example). Both the sending sensing electrode layer 28 and the receiving sensing electrode layer 29 are in the shape of a strip. The electrode layer 28 is opposite to and parallel to the receiving electrode layer 29.

The electrode layer 28 and the receiving sensing electrode layer 29 may form a capacitor. When an object touches fingerprint identification device 300, capacitance between the electrode layer 28 and the receiving sensing electrode layer 29 changes, thus the object can be detected. The controller 130 is electrically connected to the electrode layer 28 and the receiving electrode layer 29. When capacitance between the electrode layer 28 and the receiving sensing electrode layer 29 is changed, the controller 130 controls the electrode layer 28 and the receiving sensing electrode layer 29 to allow the capacitive touch sensor 320 to stop working. If the fingerprint identification element 110 continuously scans the object, and then outputs a readout signal to the controllers 130, the controller 130 controls the electrode layer 28 and the receiving sensing electrode layer 29 to allow the capacitive touch sensor 320 to start working.

Figure 6:
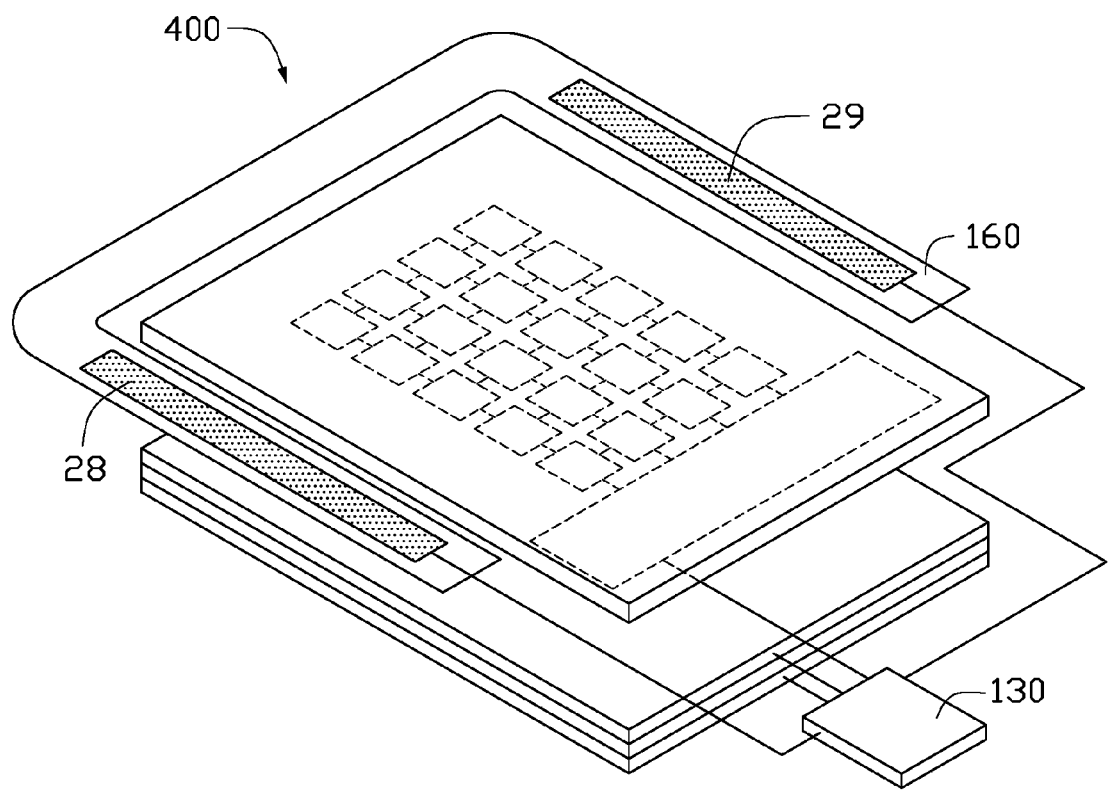
FIG. 6 is an isometric view of a fourth embodiment of a fingerprint identification device.
Figure 7:
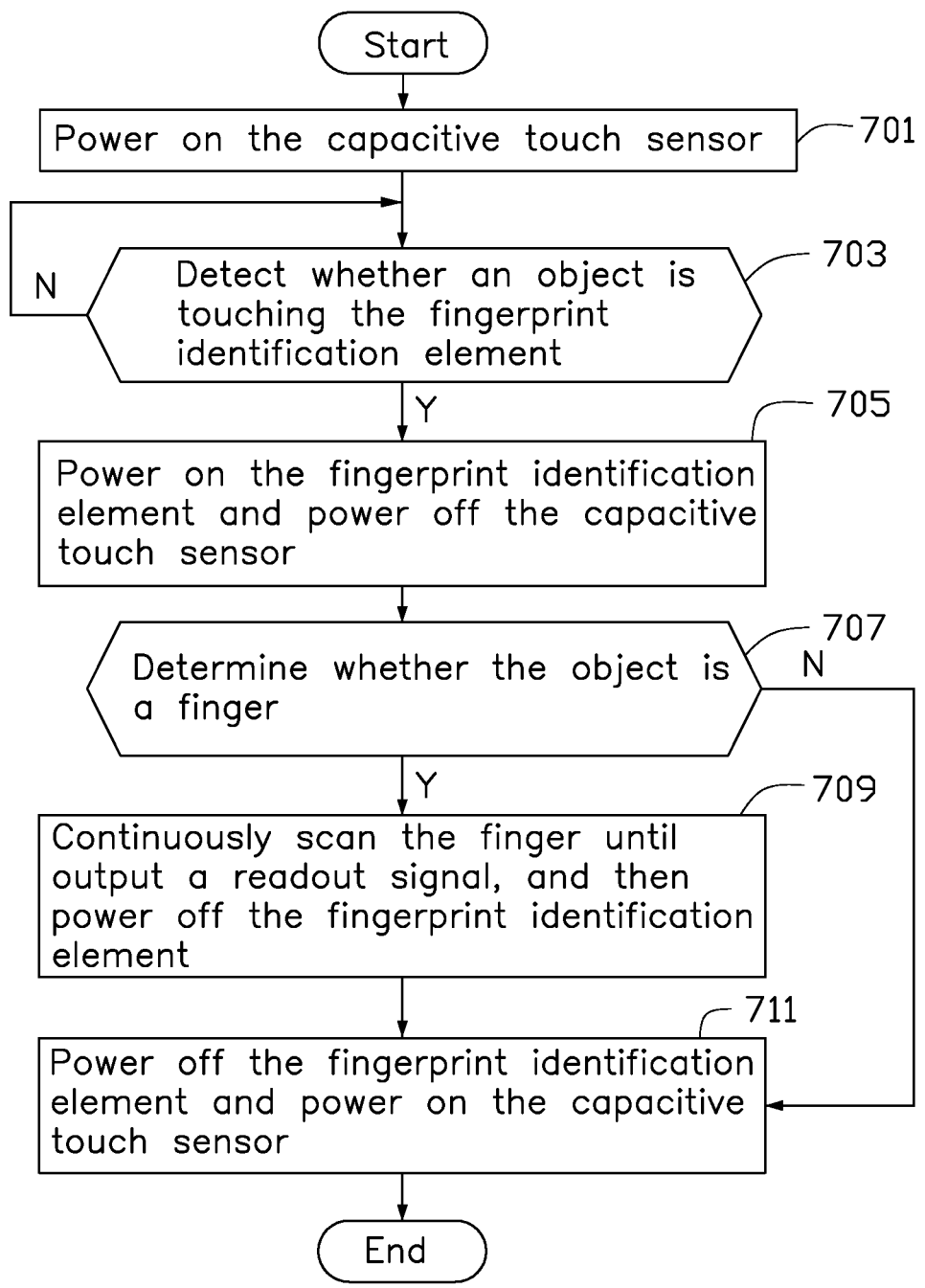
FIG. 7 is a flowchart of an embodiment of a method for identifying a fingerprint.

FIG. 6 illustrates a fingerprint identification device 400 according to a fourth exemplary embodiment. The fingerprint identification device 400 is similar to the fingerprint identification device 300 except that both the sending sensing electrode layer 28 and the receiving sensing electrode layer 29 of the fingerprint identification device 400 are formed on a flexible printed circuit board 160. Both the sending sensing electrode layer 28 and the receiving sensing electrode layer 29 of the fingerprint identification device 300 are formed on the fingerprint identification element 110. FIG. 7 illustrates a flow chart of a method for identifying a fingerprint. The example method is provided by way of example, as there are a variety of ways to carry out the method. The example method described below can be carried out using the configurations illustrated in FIGS. 2, 4, 5 and 6, for example, and various elements of these figures are referenced in explaining example method. Each block shown in FIG. 7 represents one or more processes, methods, or subroutines, carried out in the exemplary method. Furthermore, the illustrated order of blocks is by example only and the order of the blocks can change. The exemplary method can begin at block 701 according to the present disclosure. Depending on the embodiment, additional steps can be added, others removed, and the ordering of the steps can be changed.

At block 701, the capacitive touch sensor starts working when the capacitive touch sensor is powered on.

At block 703, the capacitive touch sensor continuously detects whether an object is touching the fingerprint identification element. If yes, the process goes to block 705, if no, the processes goes back to block 703.

At block 705, the controller powers on the fingerprint identification element to start working and powers off the capacitive touch sensor to stop working.

At block 707, the fingerprint identification element determines whether the object is a finger. If yes, the process goes to block 709, if no, the process goes back to block 711.

At block 709, the fingerprint identification element continuously scans the object (the finger) until output a readout signal to the controller.

At block 711, the controller powers off the fingerprint identification element to stop working and powers on the capacitive touch sensor to start working.

FIG. 8 illustrates an electronic device 500 using the fingerprint identification device 100. The electronic device 500 is a mobile phone. The electronic device 500 also comprises an optical sensor 600 electrically connected to the fingerprint identification device 100. In this embodiment, the fingerprint identification device 100 forms a button (such as Home button) of the electronic device 500. The optical sensor 600 and the fingerprint identification device 100 are mounted at a same surface of the electronic device 500, but the optical sensor 600 is far away from the fingerprint identification device 100. In this embodiment, the optical sensor 600 is mounted adjacent to the top end of the electronic device 500, and the fingerprint identification device 100 is mounted adjacent to the bottom end of the electronic device 500.

When the capacitive touch sensor 120 detects an object is touching the fingerprint identification element 110, the optical sensor 600 detects whether the object is an erroneous object, such as face of a user or pocket of a user touching the fingerprint identification element 110. In this disclosure, the correct object is finger; other things except finger are erroneous objects. If the optical sensor 600 detects an erroneous object, the capacitive touch sensor 120 continuously detects whether a new object is touching the fingerprint identification element 110. If the optical sensor 600 detects a correct object, the fingerprint identification element 110 would be powered on and the capacitive touch sensor 320 would be powered off.

Figure 9:
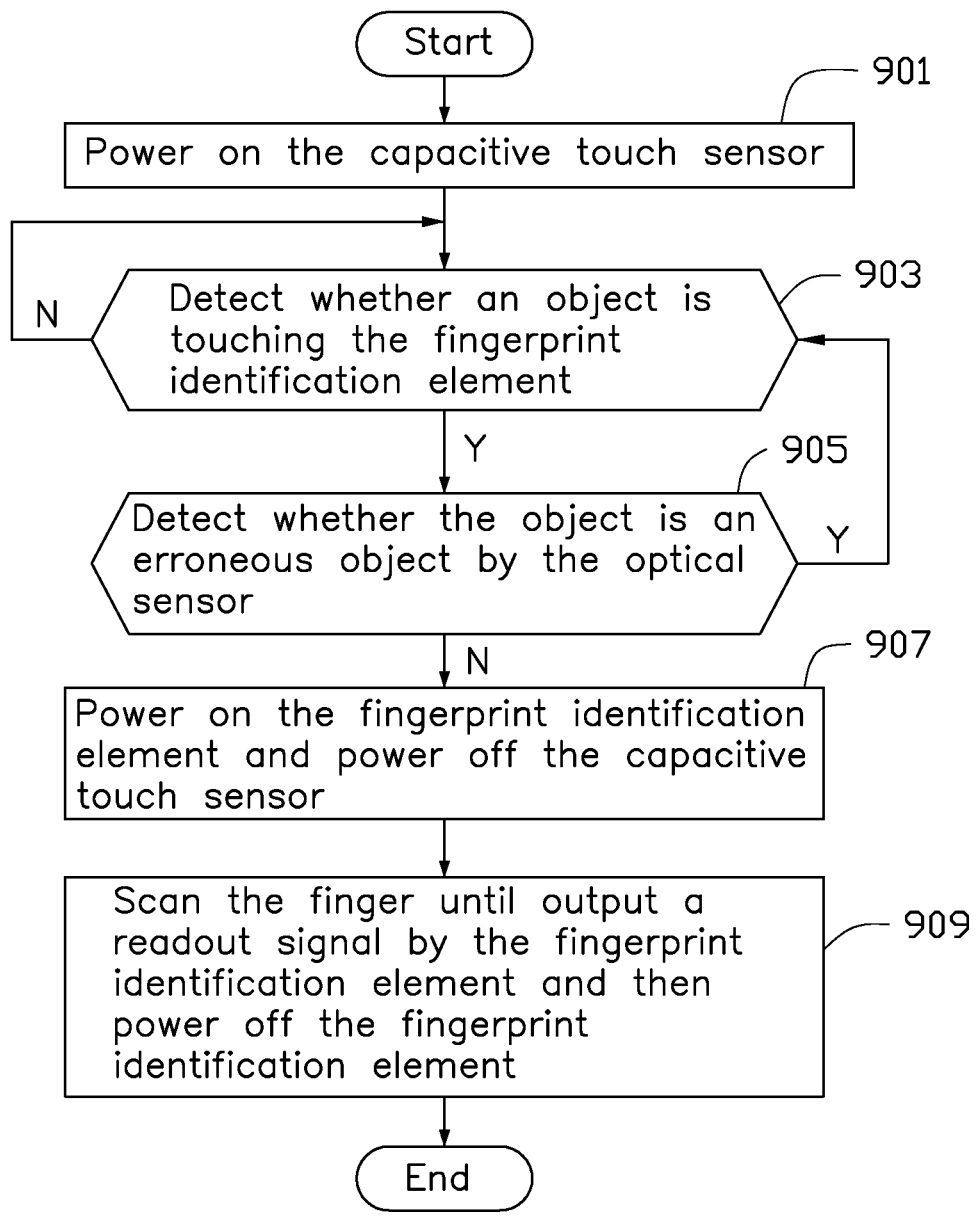
FIG. 9 is a flowchart of an embodiment of a method for preventing erroneously touching of the electronic device of FIG. 8 during fingerprint identification.

FIG. 9 illustrates a flow chart of a method for preventing erroneously touching the electronic device of FIG. 8 during fingerprint identification. The example method is provided by way of example, as there are a variety of ways to carry out the method. The example method described below can be carried out using the configurations illustrated in FIGS. 2, 4, 5, and 8, for example, and various elements of these figures are referenced in explaining example method. Each block shown in FIG. 9 represents one or more processes, methods, or subroutines, carried out in the exemplary method. Furthermore, the illustrated order of blocks is by example only and the order of the blocks can change. The exemplary method can begin at block 901 according to the present disclosure. Depending on the embodiment, additional steps can be added, others removed, and the ordering of the steps can be changed.

At block 901, the capacitive touch sensor of the fingerprint identification device starts working when the capacitive touch sensor is powered on.

At block 903, the capacitive touch sensor continuously detects whether an object is touching the fingerprint identification element 110. If yes, the process goes to block 905, if no, the process goes back to block 903.

At block 905, the optical sensor detects whether the object is an erroneous object. If yes, the process goes to block 903, if no, the process goes back to block 907.

At block 907, the controller powers on the fingerprint identification element of the fingerprint identification device to start working and powers off the capacitive touch sensor to stop working.

At block 909, the fingerprint identification element continuously scan the object (a finger) until outputs a readout signal to the controller; and then the controller powers off the fingerprint identification element.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A fingerprint identification device comprising:
   a fingerprint identification element configured to identify a fingerprint;
   a capacitive touch sensor configured to continuously detect whether an object is touching the fingerprint identification element; and
   a controller electrically connected to the fingerprint identification element and the capacitive touch sensor, the controller being configured, when the capacitive touch sensor detects an object is touching the fingerprint identification element, to control the capacitive touch sensor to stop detecting and the fingerprint identification element to start working;
   wherein the fingerprint identification element comprises a signal sending layer and a signal receiving layer stacked over the signal sending layer;
   wherein the signal sending layer comprises a first electrode layer, a second electrode layer formed on the first electrode layer, and a piezoelectric layer located between the first electrode layer and the second electrode layer; the first electrode layer and the second electrode layer are configured to apply a voltage to the piezoelectric layer; the piezoelectric layer is configured to vibrate and emit ultrasonic signals.

2. The fingerprint identification device of claim 1, wherein the capacitive touch sensor comprises a sensing electrode layer; and the sensing electrode layer is made of an electrically conductive material.

3. The fingerprint identification device of claim 2, wherein the capacitive touch sensor is in the shape of a "U", a circular ring, a rectangle frame, or a pentagon frame.

4. The fingerprint identification device of claim 1, wherein the capacitive touch sensor comprises a sending sensing electrode layer and a receiving sensing electrode layer opposite to and parallel to the sending sensing electrode layer; both the sending sensing electrode layer and the receiving sensing electrode layer are made of an electrically conductive material.

5. The fingerprint identification device of claim 1, wherein the capacitive touch sensor is formed on the fingerprint identification element and is located around the fingerprint identification element.

6. The fingerprint identification device of claim 1, wherein the capacitive touch sensor is formed on a flexible printed circuit board and is located around the fingerprint identification element.

7. The fingerprint identification device of claim 1, wherein the fingerprint identification device comprises more than one capacitive touch sensors around the fingerprint identification element.

8. The fingerprint identification device of claim 1, wherein the signal receiving layer comprises a glass substrate, and a receiving array and a readout circuit formed on a surface of the glass substrate adjacent to the signal sending layer; the receiving array is configured to receive ultrasonic signals reflected by a finger touching on the fingerprint identification device; the readout circuit is configured for converting the ultrasonic signals to electrical signals.

9. The fingerprint identification device of claim 8, wherein the capacitive touch sensor is attached to the glass substrate.

10. A method for identifying a fingerprint comprising:
powering on a capacitive touch sensor;
continuously detecting by the capacitive touch sensor whether an object is touching a fingerprint identification element;
powering on the fingerprint identification element and powering off the capacitive touch sensor by a controller if the capacitive touch sensor detects an object is touching the fingerprint identification element;
continuously scanning the object by the fingerprint identification element until the fingerprint identification element outputs a readout signal to the controller; and
powering off the fingerprint identification element and powering on the capacitive touch sensor by the controller;
wherein after the capacitive touch sensor detects an object is touching the fingerprint identification element the method further comprises:
determining by an optical sensor whether the object is an erroneous object, the correct object is finger;
continuously detecting by the capacitive touch sensor whether a new object is touching a fingerprint identification element if the optical sensor detects an erroneous object; and
powering on the fingerprint identification element and powering off the capacitive touch sensor by the controller if the optical sensor detects a correct object.

11. The method of claim 10, wherein before continuously scanning the object by the fingerprint identification element and after powering on the fingerprint identification element the method further comprises:
determining by the fingerprint identification element whether the object is a finger;
powering off the fingerprint identification element and powering on the capacitive touch sensor by the controller if the object is not a finger;
powering on the fingerprint identification element and powering off the capacitive touch sensor by the controller if the object is a finger.

12. An electronic device comprising:
a fingerprint identification device, the fingerprint identification device comprising:
a fingerprint identification element configured to identify fingerprint;
a capacitive touch sensor configured to continuously detect whether an object is touching the fingerprint identification element; and
a controller electrically connected to the fingerprint identification element and the capacitive touch sensor, the controller being configured, when the capacitive touch sensor detects an object is touching the fingerprint identification element, to control the capacitive touch sensor to stop detecting and the fingerprint identification element to start working;
wherein the fingerprint identification element comprises a signal sending layer and a signal receiving layer 18 stacked over the signal sending layer; the signal sending layer comprises a first electrode layer, a second electrode layer formed on the first electrode layer, and a piezoelectric layer located between the first electrode layer and the second electrode layer; the first electrode layer and the second electrode layer are configured to apply a voltage to the piezoelectric layer; the piezoelectric layer is configured to vibrate and emit ultrasonic signals; the signal receiving layer comprises a glass substrate, and a receiving array and a readout circuit formed on a surface of the glass substrate adjacent to the signal sending layer; the receiving array is configured to receive ultrasonic signals reflected by a finger touching on the fingerprint identification device; the readout circuit is configured for converting the ultrasonic signals to electrical signals.

13. The electronic device of claim 12, wherein the capacitive touch sensor comprises a sensing electrode layer; and the sensing electrode layer is made of an electrically conductive material.

14. The electronic device of claim 12, wherein the capacitive touch sensor comprises a sending sensing electrode layer and a receiving sensing electrode layer opposite to and parallel to the sending sensing electrode layer; both the sending sensing electrode layer and the receiving sensing electrode layer are made of an electrically conductive material.

15. The electronic device of claim 12, wherein the capacitive touch sensor is located around the fingerprint identification element; and the capacitive touch sensor is formed on the fingerprint identification element or a flexible printed circuit board.

16. The electronic device of claim 12, further comprising an optical sensor electrically connected to the fingerprint identification device; the optical sensor is configured for detecting whether the object is an erroneous object.

* * * * *